United States Patent [19]

Will

[11] 4,224,572
[45] Sep. 23, 1980

[54] BROADBAND DOUBLY BALANCED MIXER HAVING IMPROVED TERMINATION INSENSITIVITY CHARACTERISTICS

[75] Inventor: Peter Will, Denver, Colo.

[73] Assignee: Adams-Russell Co., Inc., Waltham, Mass.

[21] Appl. No.: 39,693

[22] Filed: May 16, 1979

[51] Int. Cl.² .................. H04B 1/26; H03H 7/42
[52] U.S. Cl. .................................. 455/326; 333/26; 333/34; 333/238; 455/331
[58] Field of Search ............ 325/435, 437, 442, 445, 325/446, 449, 450; 333/25, 26, 33, 34, 238, 239, 245, 246; 363/157, 158, 159

[56] References Cited

U.S. PATENT DOCUMENTS

| | | | |
|---|---|---|---|
| 3,523,260 | 8/1970 | Gunshinan et al. | 333/26 |
| 3,652,941 | 3/1972 | Neuf | 325/446 |
| 3,678,395 | 7/1972 | Hunton et al. | 325/446 |
| 4,032,850 | 6/1977 | Hill | 333/26 |
| 4,063,176 | 12/1977 | Milligan et al. | 325/449 |
| 4,125,810 | 11/1978 | Pavio | 325/440 |

Primary Examiner—Robert L. Richardson
Assistant Examiner—Tommy P. Chin
Attorney, Agent, or Firm—Charles Hieken

[57] ABSTRACT

A diode modulator type electrical mixer network has at least two hybrids of transmission line construction, interconnected by means of two sets of four or more diodes arranged in bridge circuit configurations. The interconnecting configuration provides a novel means of local oscillator injection that allows the mixer to operate in a mode that substantially reduces the mixer's susceptability to effects caused by reflective external source and load termination impedances differing from an ideal 50 ohm nonreflective condition.

11 Claims, 5 Drawing Figures

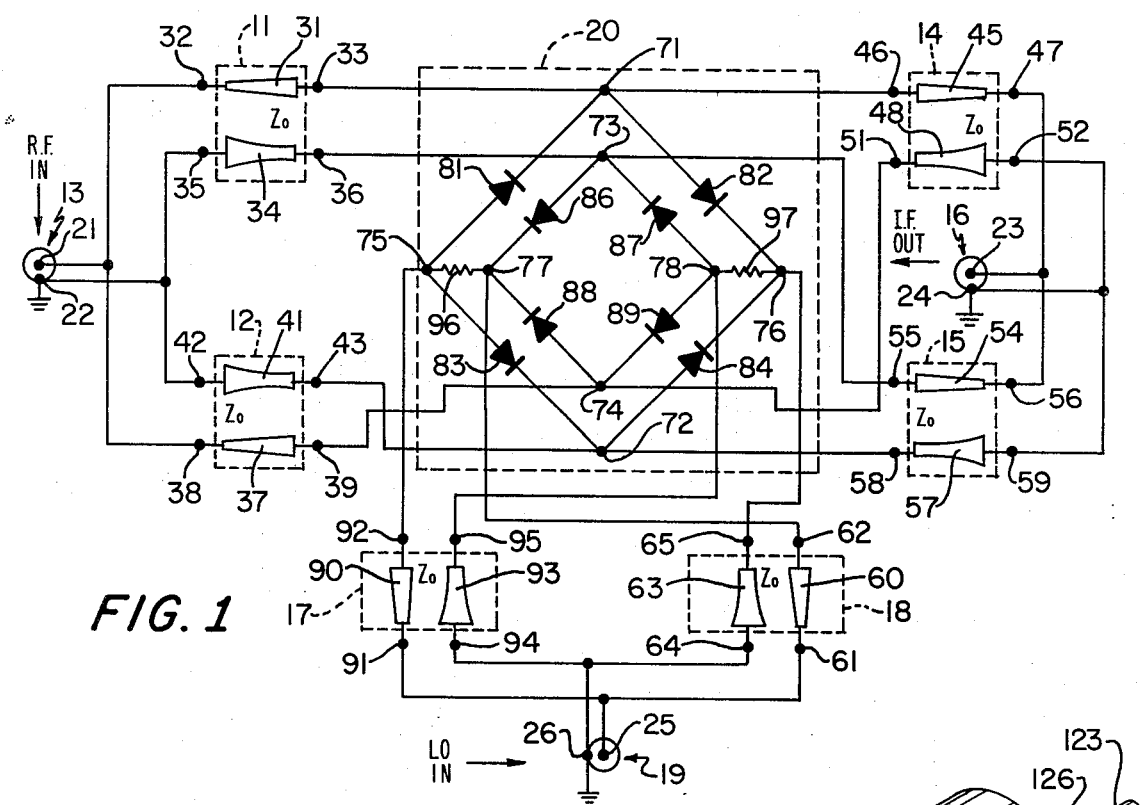
FIG. 1
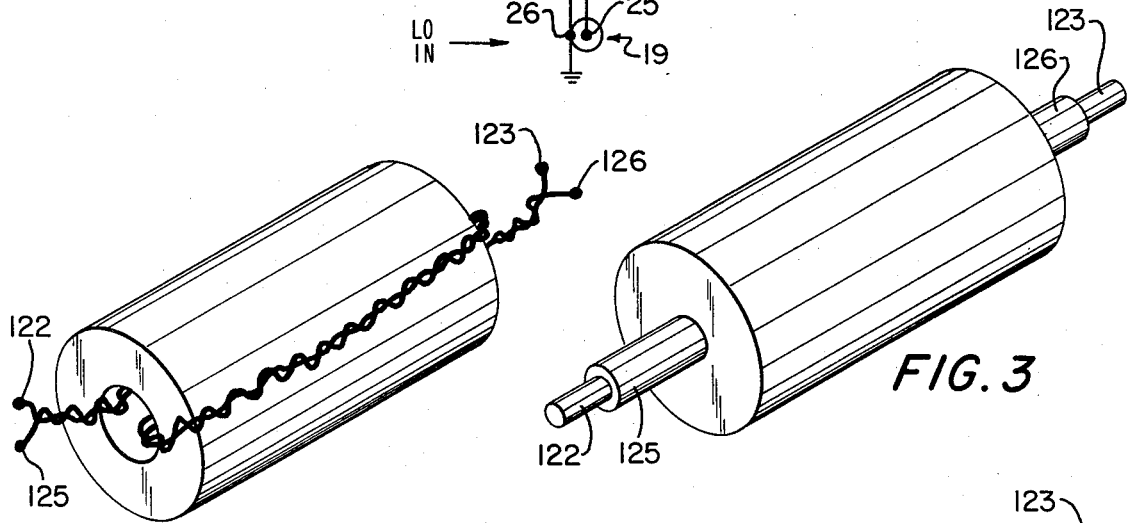
FIG. 2
FIG. 3
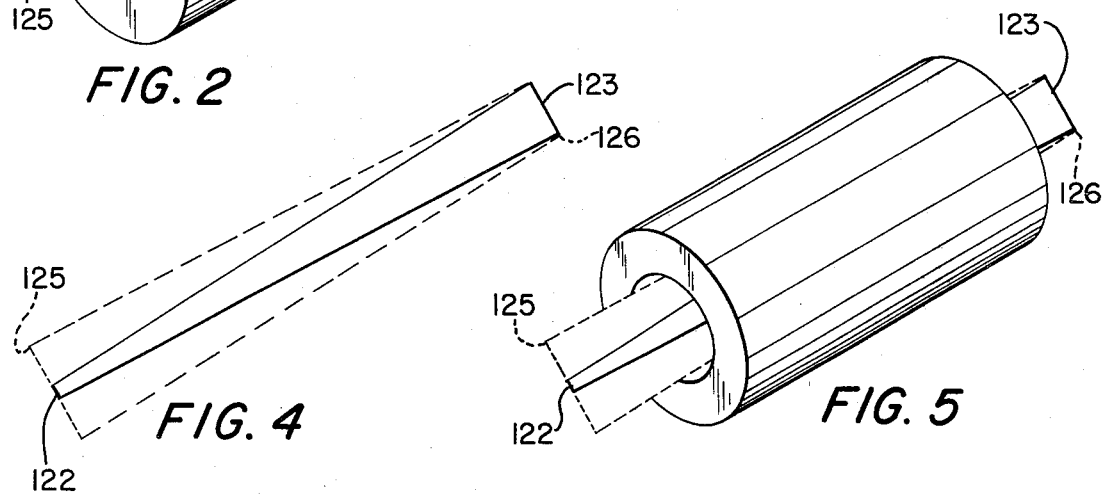
FIG. 4
FIG. 5

BROADBAND DOUBLY BALANCED MIXER HAVING IMPROVED TERMINATION INSENSITIVITY CHARACTERISTICS

BACKGROUND OF THE INVENTION

The present invention relates in general to mixer circuits, and more particularly to doubly balanced mixer circuits characterized by a significant reduction in distortion.

The ever increasing number of R.F. signals present in our environment presents problems for modern communication systems to achieve a high dynamic range. Mixers are generally a dominant contributor to internally generated communication system distortion products that reduce system dynamic range. Certain of these distortions products may be avoided by choosing system frequencies that do not cause interference products to occur or by using frequency selective networks or filters at each of the mixer's input and output ports. Some of these distortion products become impossible to avoid and also to eliminate by use of frequency selective networks.

One of such distortion products that occurs when multiple RF signals are present may be expressed in the form $(F_{LO} \pm F_{RF1} \pm 2F_{RF2})$ and $(F_{LO} \pm 2F_{RF1} \pm F_{RF2})$, commonly referred to as 3rd Order intermodulation Distortion (IMD). This set of distortion products normally cannot be removed by the use of frequency selective networks or filters because the desired RF input frequencies $(F_{RF1})$ and $(F_{RF2})$ may be too closely spaced in frequency to allow the use of a realizeable filter network. Also, internally generated mixer IMD increases dramatically when frequency selective networks or filters are connected directly to the ports of a conventional mixer constructed utilizing prior art techniques. The effects of IMD on mixer operation is described by Peter Will in "Reactive Loads—The Big Mixer Menace," published in the April 1971 of Microwaves, Vol. 10, No. 4, p.p. 38–42, and "Uncover Mixer Intermod with Swept Meausrements," Vol. 17, No. 11, p.p. 84–91, November 1978.

Conventional doubly balanced mixer circuits rely upon the symmetry or balance of both diodes and transformers for cancellation or supression of even order $(2F_{RF1}, 2F_{RF2})$ frequency terms. These circuits may be considered to have the local oscillator current from a local oscillator input signal flowing in series through each one of the diodes in the alternately conducting pair of diodes, while the RF current from an RF input signal flows through the same pair of diodes in parallel. It is possible to have different values of current flow in each conducting diode causing an unbalanced condition.

Cancellation effects of IMD can occur when one diode in each of the alternately conducting pairs of diodes are biased at different levels as described by J. H. Lepoff and A. M. Cowley, in "Improved Intermodulation Rejection in Mixers" published in IEEE Transactions on Microwave Theory and Techniques, MTT vol. 54, pp. 616–622, December, 1966. Conditions similar to those responsible for IMD cancellation can also cause serious IMD increases. Since a doubly balanced mixer is really a "bi-phase" modulator, wherein the RF port is commutated to the IF port with a 180° phase reversal ocurring during each half of the LO cycle, the mixer's RF input impedance is theoretically a direct function of its IF port termination impedance. When an RF signal source is connected to the RF port of a mixer that has a completely reflective IF port termination, the RF input voltage or RF input current acting upon the diodes may be up to twice the matching impedance RF voltage or twice the matched impedance RF current available to the mixer under nonreflective termination conditions. IMD products generated by each of the diodes higher order 4th and 6th coefficients of a series expansion around an LO bias point are summed at the mixer's IF port. It has been determined that large increases in mixer generated IMD is a result of an impedance mismatch or reflective IF port termination. Examples of such termination sensitive mixers are Anzac Model MD-123, MD-525 mixers and the similar mixer described in U.S. Pat. No. 4,063,176.

In an effort to reduce mixer generated IMD, designers have evolved further classes of doubly balanced mixers wherein each diode is replaced by the various circuit element combinations. These efforts have only met with partial success and normally require an increase in local oscillator input power to realize any improvements in mixer generated IMD.

Accordingly, it is an object of the present invention to provide a novel broadband frequency mixer adapted to efficiently operate despite non-ideal reflective source and load terminations.

Another object of the present invention is a reduction of mixer generated IMD when the mixer is operating with non-ideal reflective source and load terminations.

A further object of this invention is to minimize any changes in mixer generated IMD under any combination of source and load impedance conditions.

A further object of this invention is to provide an improved doubly balanced mixer in which all of the mixer's signal ports are mutually interchangeable.

Other objects, advantages and capabilities of the present invention will become more apparent as the description proceeds taken in conjunction with the accompanying drawings, in which like parts have similar reference numbers.

SUMMARY OF THE INVENTION

In a broadband mixer having first, second and third balun means connected between first, second and third signal ports and frequency converter means including first and second sets of nonlinear devices arranged to convert first and second high frequency electrical signals applied to the first and second signal ports to a third high frequency signal at the third signal port, the improvement comprises connecting the first balun means to the second balun means to form a first 0–180 degree hybrid junction preventing transmission of high frequency electrical signals between the first and second signal ports. First and second resistors are connected to said third balun means and said frequency converter means to form a second 0–180 degree hybrid junction preventing transmission of high frequency electrical signals between said third signal port and said first and second signal ports.

BRIEF DESCRIPTION OF THE DRAWING

FIG. 1 is a schematic circuit drawing of the preferred embodiment; and

FIGS. 2-5 show some alternate forms of baluns.

DETAILED DESCRIPTION OF PREFERRED EMBODIMENTS

Referring now to FIG. 1 in the schematic diagram, there is shown a broadband mixer which in general comprises two baluns 11 and 12 associated with a signal port 13, two baluns 14 and 15 associated with a signal port 16, and two baluns 17 and 18 associated with a signal port 19 together with a frequency converter generally designated by numeral 20 coupled between the baluns 11, 12, 14, 15, 17 and 18.

In the mixer circuit described herein, signal port 13 is suitable for operating in a frequency range from 0.5 MHz to 20 GHz and for purposes of indentification is herein referred to generally as the first signal port and is specifically referred to as the radio frequency or RF signal port because this signal port normally inputs or outputs a signal in the RF range. Signal port 19 is suitable for operating in the frequency range from 0.5 MHz to 20 GHz and is generally herein referred to as the second signal port and specifically referred to as the local oscillator or LO signal port. Signal port 16 is suitable for operation in the frequency range from 0.5 MHz to 20 GHz and is herein referred to generally as the third signal port and specifically referred to as the intermediate frequency or IF signal port. These specific definitions for the three signal ports are those commonly used in the trade in mixer circuits and the like. All three signal ports, 13, 16 and 19 of the present invention are mutually interchangeable and may input or output. Signal port 19 normally would have an input signal and signal ports 13 and 16 normally have a range of signals and may be used to either input or output a signal and to step up or step down the frequency of a signal, as described more fully hereinafter.

For purposes of identification and explanation of the mixer circuit, the RF signal port 13 is shown as having a pair of terminals 21 and 22, with terminal 22 being connected to ground, the LO signal port 19 is shown as having a pair of terminals 25 and 26 with terminal 26 being connected to ground and the IF signal port 16 has a pair of terminals 23 and 24 with terminal 24 connected to ground.

Each of the baluns 11, 12, 14, 15, 17 and 18 is of a similar construction and in the embodiment shown may be characterized as tapered ground plane and tapered signal conductor balanced microstrip transmission line balanced to unbalanced mode transformers and are further described in U.S. Pat. No. 4,063,176. Balun 11 has a conductor 31 shown with terminals 32 and 33 at opposite ends thereof and a tapered ground plane 34 shown with terminals 35 and 36 at opposite ends thereof. Terminals 33 and 36 are a terminal pair on the side of the balun 11 opposite the RF signal port 13, and terminals 32 and 35 are a terminal pair on the RF signal port side of balun 11. Terminal 32 is connected by a line to terminal 21 of the RF signal port 13 and terminal 35 is connected by a line to the terminal 22 of the RF signal port 13 which is at ground so that the wide end of the tapered ground plane is connected to ground. When a signal is applied to RF signal port 13 there is an unbalanced signal with respect to ground at terminals 32 and 35. For one mode of operation wherein an RF signal is applied to the RF signal port 13, the terminal pair 32 and 35 are input terminals with an unbalanced input signal and terminals 33 and 36 the output terminals with a balanced to ground RF signal produced at terminals 33 and 36 as a result of the operation of the balun 11. However, since signals may input or output from each of the signal ports as discussed hereinafter, terminal pair 32 and 35 are input terminals for only one mode of operation wherein the signal applied at port 13 produces a signal at a lesser frequency at port 16.

Balun 12 has conductor 37 shown with terminals 38 and 39 at opposite ends thereof and a tapered ground plane 41 shown with terminals 42 and 43 at opposite ends thereof. Terminals 39 and 43 are a terminal pair on the side of the balun opposite the RF signal port 13 and terminals 38 and 42 are a terminal pair on the RF signal port side. Terminal 38 is connected by a line to terminal 21 of the RF signal port and terminal 42 is connected by a line to terminal 22 of the RF signal port which is at ground so that the wide end of the tapered ground plane 41 is connected to ground. When an unbalanced RF signal is applied to the RF signal port 13, and terminals 38 and 42, there is a balanced signal with respect to ground at terminals 39 and 43 as a result of the operation of balun 12.

Balun 14 has a conductor 45 with terminals 46 and 47 at opposite ends thereof and a tapered ground plane 48 with terminals 51 and 52 at opposite ends thereof. Terminals 47 and 52 then are a terminal pair on the IF signal port side of balun 14, and terminals 46 and 51 are a terminal pair on the side of balun 14 opposite the IF signal port. As a result of coupling a balanced signal to terminals 46 and 51 the signal applied to terminals 47 and 52 is an unbalanced to ground signal. In turn, balun 15 has a conductor 54 with terminals 55 and 56 at opposite ends thereof and a tapered ground plane 57 with terminals 58 and 59 at opposite ends thereof. Terminals 56 and 59 are a terminal pair on the IF signal port side of balun 15, and terminals 55 and 58 are a terminal pair on the side of balun 15 opposite the IF signal port. Again with a balanced signal applied to terminals 55 and 58, an unbalanced signal is applied to terminals 56 and 59.

Balun 17 has a conductor 90 with terminals 91 and 92 at opposite ends thereof and a tapered ground plane 93 with terminals 94 and 95 at opposite ends thereof. Terminals 91 and 94 then are a terminal pair on the LO signal port side of balun 17, and terminals 92 and 95 are a terminal pair on the side of balun 17 opposite the LO signal port 19. As a result of coupling signal to port 19, the signal applied to terminals 91 and 94 is an unbalanced signal and the signal applied to terminals 92 and 95 is a balanced to ground signal. In turn, balun 18 has a conductor 60 with terminals 61 and 62 at opposite ends thereof and a tapered ground plane 63 with terminals 64 and 65 at opposite ends thereof. Terminals 61 and 64 are a terminal pair on the LO signal port side of balun 18, and terminals 62 and 65 are a terminal pair on the side of balun 18 opposite to the signal port. An unbalanced to ground signal coupled to terminals 61 and 64 is transformed by balun 18 to a balanced to ground signal at terminals 62 and 65.

Unlike prior art mixers having a plurality of baluns connected to a frequency converter, such as described in U.S. Pat. No. 4,063,176 and Anzac MD-123 and MD-525 mixers, frequency converter 20 includes a double balanced bridge having separate inner and outer rings of four matched nonlinear devices or diodes per ring interconnected by resistor elements or other dissipative means 96 and 97 for absorbing undesired signals responsible for IMD.

The outer ring of the frequency converter 20 includes a first pair of matched nonlinear devices in the form of diodes 81 and 82 connected between terminal 71 and terminals 75 and 76. A second pair of matched nonlinear devices in the form of diodes 83 and 84 are connected between terminal 72 and terminals 75 and 76. Diodes 81 and 82 are poled in the same direction to form a first series circuit with an anode terminal of diode 81 connected to terminal 75 and a cathode terminal of diode 82 connected to terminal 76. Diodes 83 and 84 are poled in the same direction to form a second series circuit with an anode terminal of diode 83 connected to terminal 75 and a cathode terminal of diode 84 connected to terminal 76.

The inner ring of the frequency converter 20 includes a first pair of matched diodes 86 and 87 connected between terminal 73 and terminals 77 and 78. A second pair of matched diodes 88 and 89 are connected between terminal 74 and terminals 77 and 78. Diodes 86 and 87 are poled in the same direction to form a first series circuit with an anode terminal of diode 87 connected to terminal 78 and a cathode terminal of diode 86 connected to terminal 77. Diodes 88 and 89 are poled in the same direction to form a second series circuit with an anode terminal of diode 89 connected to terminal 78 and a cathode terminal of diode 88 connected to terminal 77.

The frequency converter 20 has a pair of terminals 71 and 72 on the outer ring and a pair of terminals 73 and 74 on the inner ring associated with the RF signal port 13 and the IF signal port 16. The terminals 71, 72, 73 and 74 are the junctions of serially connected diodes poled in the same direction. The LO signal port is associated with a pair of terminals 75 and 76 on the outer ring and a pair of terminals 77 and 78 on the inner ring. The terminals 75, 76, 77 and 78 are the junctions of serially connected diodes poled in opposite directions.

The baluns 11, 12, 14 and 15 are electrically interconnected with each other and the converter 20 so as to electrically isolate the RF port 13 from the IF port 16 and the inner diode ring from the outer diode ring. In particular, terminals 33 and 36 of balun 11 are connected by separate conductors to terminals 71 and 73, respectively, of the converter 20, and terminals 46 and 55, respectively, of baluns 14 and 15. Terminals 39 and 43 of balun 12 are connected by separate conductors to terminals 74 and 72, respectively, of the converter 20 and terminals 51 and 58, respectively, of baluns 14 and 15. It is well known that the aforementioned interconnection between baluns 11 and 12 and baluns 14 and 15 forms a first 0-180 degree hybrid junction providing the desired electrical isolation preventing transmission of applied high frequency electrical signals between the RF signal port 13 and the IF signal port 16. As used herein, the term 0-180 degree hybrid junction refers to a transmission line arrangement having four branches such that when the branches are properly terminated, energy can be transferred from any one branch into only two of the remaining three. This energy is equally divided between the two branches commonly referred to as adjacent ports and may be either 180 degrees out of phase or in phase with each other. Depending upon the input port selected. However, unlike prior art broadband mixers, balun 17 and 18 are connected to the converter 20 and the resistors 96 and 97 so as to prevent transmission of applied high frequency signals between the LO port 19 and the RF port 13 and the IF port 16. Specifically terminal 92 of balun 17 and terminal 62 of balun 18 are connected to terminal 75 and terminal 77 respectively, of the converter 20 with resistor element 96 connected between terminals 75 and 77. It has been determined that a 100 ohm resistor is suitable for use as resistor element 96. Terminal 95 of balun 17 and terminal 65 of balun 18 are connected to terminals 76 and 78, respectively, of the converter 20 with resistor element 97 connected between terminals 76 and 78. It has been determined that a 100 ohm resistor is suitable for use as resistor element 97. The interconnections of the resistors 96 and 97 with the baluns 17 and 18 form a second 0-180 degree hybrid junction providing the desired electrical isolation between the LO signal port 19 and the RF and IF signal ports 13 and 16. The second 0-180 degree hybrid junction also isolates the inner diode ring from the outer diode ring, because of the well known property of isolation existing between opposite ports of a 0-180 degree hybrid junction.

Under operating conditions, an IF signal is provided at the IF signal port 16 when an LO signal is applied to the LO signal port 19 and an RF input signal is applied to the RF signal port 13, as is usual practice with a mixer circuit. The LO signal is applied to the LO signal port 19 in an unbalanced mode between input terminal 25 and ground terminal 26 but is converted by the baluns 17 and 18 to two sets of signals balanced with respect to ground at the balun 17 and 18 output terminals, 92, 95, and 62, 65. A first set of LO signals is present at balun 17 terminals 92 and 95 with a voltage, E, at 92 being positive with respect to terminal 95. A second set of LO signals is present at balun 18 terminals 62 and 65 with a voltage, E, at 62 being positive with respect to terminal 65.

The terminals 91 and 94 of balun 17 and terminals 61 and 64 of balun 18 are connected to terminals 25 and 26 to form an input port 19 of the second 0-180 degree hybrid junction. Balun 17 and 18 terminal pair 92 and 62 form a first output port of the second 0-180 degree hybrid junction. Balun 17 and 18 terminal pair 95 and 65 form a second output port of the second 0-180 degree hybrid junction. Resistor 96 is connected to balun 17 terminal 92 and balun 18 terminal 62 and resistor 97 is connected to balun 17 terminal 95 and balun 18 terminal 65 to form a fourth port of second 0-180 degree hybrid junction. The resistors 96 and 97 provide internal loads that are electrically isolated from the LO signal input port 19. The well known properties of isolation between opposite ports of two 0-180 degree hybrid junctions is advantageously used to electrically isolate the terminal pair 92 and 65 from the pair 95 and 62.

When a positive LO input voltage is applied to the LO signal port 19 terminal 25, the voltage at balun 17 terminal 92 is positive with respect to the voltage at balun 18 terminal 65, whereby the voltage at frequency converter terminal 75 is positive with respect to frequency converter terminal 76. Thus, it is apparent that a positive LO input voltage of sufficient magnitude causes the diodes 81, 82, 83 and 84 of the outer ring to be forward biased into a current conducting or low resistance state. The same positive LO input voltage applied to the LO signal port 19 terminal 25 causes the voltage at terminal 95 of balun 17 to be negative with respect to the voltage at terminal 65 of balun 18, whereby the voltage at frequency converter terminal 78 is negative with respect to frequency converter terminal 77. A negative voltage at terminal 78 relative to terminal 77 provides a reverse bias causing the diodes 86, 87, 88 and 89 of the inner ring to be in a nonconducting or very high resistance state. Conversely, a negative LO input voltage applied to the LO signal port 19 terminal 25 causes the voltage polarity at the aforementioned frequency converter terminals 75, 76, 77 and 78 to be reversed, whereby the diodes 86, 87, 88 and 89 are forward biased and the diodes 81, 82, 83, and 84 of the outer ring are reverse biased. The interconnection of the balun pair 17, 18 with the converter 20 allows the switching of the diodes between conducting and non-conducting states to be determined solely by the magnitude and polarity of the LO signal. The switching of the diodes from conducting to nonconducting states is responsible for the mixing operation.

It should be noted that the converter 20 is coupled to the LO balun pair 17 and 18 so as to enhance a mutual isolation between the diodes 81, 82, 83 and 84 of the outer ring and the diodes 86, 87, 88 and 89 to improve the ability of the diodes in the inner and outer rings to switch between conducting and nonconducting states. In particular, the terminals 75, 76 of the outer ring are respectively connected to terminal 92 of balun 17 and terminal 65 of balun 18, and terminals 77, 78 of the inner ring are respectively connected to terminal 62 of balun 18 and terminal 95 of balun 17. Since the balun terminals 92, 65 are mutually isolated from the balun terminals 62, 95, the outer diode ring is mutually isolated from the inner diode ring. This arrangement generally improves the ability of the diodes in the inner and outer rings to switch between conducting and nonconducting states since the maximum reverse bias voltage applied to a nonconducting diode is not limited to the forward voltage potential of a corresponding conducting diode as in the case of a conventional mixer circuit. In addition this same condition of diode operation allows the mixer to accept RF input signal power levels equal to within three dB of the LO input signal power, producing less than a one dB increase in mixer conversion loss.

An unbalanced RF input signal at the RF signal port 13 terminals 21 and 22 with terminal 22 being connected to ground is applied to the frequency converter terminals 71, 72, 73 and 74 in a balanced mode because of the known operation of the baluns 11 and 12. The IF signal port 16 output baluns 14 and 15 are cross connected to the frequency converter terminals 71, 72, 73 and 74 to conduct the desired IF output signals generated by the diode set 81, 82, 83 and 84 and the diode set 86, 87, 88 and 89 to the IF signal port 16. The available IF output signal is present in an unbalanced mode at the IF signal port 16 terminals 23 and 24 with terminal 24 being connected to ground.

The frequency converter terminals 71, 72, 73, 74, 75, 76, 77 and 78 are arranged to be balanced with respect to ground by the operation of the baluns 11, 12, 14, 16, 17 and 18, whereby unwanted or undesired frequency components of electrical signals appear as an unbalanced voltage or unbalanced current signal at the frequency converter terminal pair 75 and 76 and also at the terminal pair 77 and 78. The unbalanced voltage or unbalanced current signals are absorbed by power dissipation in the resistors 96 and 97. An example of undesired frequency components of electrical signals include Third Order Intermodulation Distortion (IMD) or those components that are even integers of their input signal harmonic numbers such as $[F_{LO} \pm (F_{RF1} \pm 2F_{RF2})]$ and $[F_{LO} \pm (F_{RF2} \pm 2F_{RF1})]$, where $F_{LO}$ is the frequency of the LO signal, $F_{RF1}$ is the frequency of a first RF signal and $F_{RF2}$ is the frequency of a second RF signal.

Source and load impedance mismatches at the RF signal port and IF signal port of prior art mixers having a converter with inner and outer diode rings caused severely unbalanced voltage or current signals and the unwanted frequency components referred to above as IMD. Unlike prior art mixers, unwanted unbalanced voltages or currents at terminal pair 75 and 76, and terminal pair 77 and 78 are absorbed by the internal load resistors 96 and 97, thereby preventing the mixer from internally generating large amounts of IMD when the impedances of the RF signal port 13 and IF signal port 16 are mismatched. Principles and conditions of operation are similar with respect to unwanted frequency component absorption when any of the mixer signal ports 13, 16 and 19 are interchanged to receive an RF signal, LO input signal and IF output signal.

The specific form of balun is not a part of the invention. Referring to FIGS. 2-5 there are shown suitable forms of known baluns between one terminal pair 122, 125 and a second terminal pair 123, 126 with terminals 122 and 125 conductively connected to terminals 123 and 126, respectively. FIG. 2 shows a twisted pair forming a turn around a toroidal ferrite core. FIG. 3 shows a length of coaxial conductors surrounded by a ferrite core. FIG. 4 shows a microstrip balun with tapered conductors. FIG. 5 shows a microstrip balun with tapered conductors inside a toroidal ferrite core.

It is evident that those skilled in the art may now make numerous other departures from and uses and modifications of the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. In a broadband mixer having first, second, and third balun means connected between first, second and third signal ports and frequency converter means including first and second sets of nonlinear devices arranged to convert first and second high frequency electrical signals applied to said first and second signal ports to a third high frequency electrical signal at said third signal port, the improvement comprising:

said first balun means being connected to said second balun means and said frequency converter means to form a first 0-180 degree hybrid junction preventing transmission of high frequency electrical signals between said first and second signal ports; and first and second dissipative means for absorbing undesired signal harmonic energy applied to said third balun means and said frequency converter means to form a second 0-180 degree hybrid junction preventing transmission of high frequency electrical signals between said third signal port and said first and second signal ports.

2. The broadband mixer according to claim 1, wherein said third balun means include first and second baluns, said first balun having an end of a first conductor electrically connected to an end of a first conductor of said second balun and an end of second conductor of said first balun electrically connected to an end of a second conductor of said second balun forming said first signal port, an opposite end of said first conductor of said first balun being electrically connected to an end of said first dissipative means and said first set of nonlinear devices, an opposite end of said first conductor of said second balun being electrically connected to an opposite end of said dissipative means and said second set of nonlinear devices, an opposite end of said second conductor being electrically connected to said first set of nonlinear devices and an end of said second resistor, an opposite end of said second conductor being electrically connected to said second set of nonlinear devices and an opposite end of said second resistor to enable a high frequency electrical signal applied to said first signal port to independently control switching of said nonlinear devices between conducting and nonconducting states.

3. The broadband mixer according to claim 1, wherein said first and second 0–180 degree hybrid junctions are connected to said frequency converter means to electrically isolate said first set of nonlinear devices from said second set of nonlinear devices.

4. The broadband mixer according to claim 1, wherein said dissipative means are connected to said third balun means and said frequency converter means between said first and second sets of nonlinear devices to dissipate even order frequency components of electrical signals generated by said nonlinear devices.

5. The broadband mixer according to claim 1, wherein said first set of nonlinear devices of said frequency converter means include first, second, third and fourth diodes connected between first and second terminals of said converter means, said first diode having a cathode connected to said first converter terminal and an anode connected to a cathode of said second diode, an anode of said second diode being connected to said second converter terminal, said third diode having a cathode connected to said first converter terminal and an anode connected to a cathode of said fourth diode, an anode of said fourth diode being connected to said second converter terminal; and said second set of nonlinear devices of said frequency converter means include first, second, third and fourth diodes connected between said first and second diodes connected between said first and second converter terminals, said first diode of said second set having a cathode connected to said first converter terminal and an anode connected to a cathode of said second diode of said second set, an anode of said second diode of said second set being connected to said second converter terminal, said third diode of said second set second set having a cathode connected to said first converter terminal and an anode connected to a cathode of said fourth diode of said second set, an anode of said fourth diode of said second set being connected to said second converter terminal.

6. A broadband mixer comprising:
frequency converter means having first and second sets of nonlinear devices adapted to provide a high frequency output signal in response to first and second high frequency input signals,
first and second balun means connected to said frequency converter means and to each other to form a first 0–180 degree hybrid junction having a first input port for receiving and conducting said first input signal to said frequency converter and an output port for transmitting said output signal from said frequency converter, and
third balun means having first and second resistors connected to said frequency converter means between said first and second sets of nonlinear devices to form a second 0–180 degree hybrid junction providing a second input port for receiving and transmitting said second input signal to said frequency converter.

7. A broadband mixer according to claim 6, wherein said first set of nonlinear devices include a first diode having an anode connected to a cathode of a second diode, a third diode having an anode connected to a cathode of a fourth diode, an anode of said second diode being connected to an anode of said fourth diode, a cathode of said first diode being connected to a cathode of said third diode, and said second set of nonlinear devices include a first diode having an anode connected to a cathode of a second diode, a third diode having an anode connected to a cathode of a fourth diode, an anode of said second diode being connected to an anode of said fourth diode, a cathode of said first diode being connected to a cathode of said third diode.

8. A broadband mixer according to claim 7, wherein said first resistor is connected between said anode of said fourth diode of said first set and said cathode of said first diode of said second set, and said second resistor is connected between said cathode of said first diode of said first set and said anode of said second diode of said second set to dissipate even order frequency components of electrical signals generated by said diodes.

9. A broadband mixer according to claim 7, wherein said third balun means include first and second baluns, said first balun having a first conductor with one end connected to one end of a first conductor of said second balun and an opposite end of said first conductor of said first balun connected to said anode of said fourth diode of said first set, an opposite end of said first conductor of said second balun being connected to said cathode terminal of said first diode of said second set, said first balun having a second conductor with one end connected to one end of a second conductor of said second balun and an opposite end of said second conductor of said first balun connected to said anode of said second diode of said second set, an opposite end of said second conductor of said second balun being connected to said cathode of said first diode of said first set, said one ends of said first and second conductors of said first balun being said second input port for receiving and transmitting said second input signal to said opposite ends of said conductors of said first and second baluns to independently control switching of said diodes between conducting and nonconducting states.

10. A broadband mixer according to claim 7, wherein said first balun means include first and second baluns, said first balun having a first conductor with one end connected to one end of a first conductor of said second balun and an opposite end of said first conductor of said first balun connected to said anode of said first diode of said first set, an opposite end of said first conductor of said second balun being connected to said anode of said third diode of said second set, said first balun having a second conductor with one end connected to one end of said second conductor said first balun connected to said anode of said first diode of said second set, an opposite end of said second conductor of said second balun being connected to said cathode of said fourth diode of said first set, said one ends of said first and second conductors of said first balun being said first input port for receiving and transmitting said first input signal to said opposite ends of said conductors of said first and second baluns.

11. A broadband mixer according to claim 7, wherein said second balun means include first and second baluns, said first balun having a first conductor with one end connected to one end of a first conductor of said second balun and an opposite end of said first conductor of said first balun connected to said anode of said first diode of said first set, an opposite end of said first conductor of said second balun being connected to said anode of said first diode of said second set, said first balun having a second conductor with one end connected to one end of a second conductor of said second balun and an opposite end of said second conductor of said first balun connected to said anode of said third diode of said second set, an opposite end of said second conductor of said second balun being connected to said cathode of said fourth diode of said first set, said one ends of said first and second conductors of said first balun being said output port for transmitting said output signal from said frequency converter generated by said diodes and coupled to said opposite ends of said conductors of said first and second baluns.

* * * * *